United States Patent
Kokaba et al.

(10) Patent No.: US 12,484,368 B2
(45) Date of Patent: Nov. 25, 2025

(54) SCALABLE METHOD OF FABRICATING A FLEXIBLE PEROVSKITE SOLAR CELL

(71) Applicant: Solaires Entreprises Inc., Victoria (CA)

(72) Inventors: Mohammad Reza Kokaba, Victoria (CA); Yameen Ahmed, Victoria (CA); Makhsud Saidaminov, Victoria (CA)

(73) Assignee: Solaires Entreprises Inc., Victoria (CA)

( * ) Notice: Subject to any disclaimer, the term of this patent is extended or adjusted under 35 U.S.C. 154(b) by 202 days.

(21) Appl. No.: 18/431,271

(22) Filed: Feb. 2, 2024

(65) Prior Publication Data

US 2025/0255084 A1    Aug. 7, 2025

(51) Int. Cl.
| | | |
|---|---|---|
| H10K 30/85 | (2023.01) | |
| H10K 30/40 | (2023.01) | |
| H10K 30/50 | (2023.01) | |
| H10K 30/82 | (2023.01) | |
| H10K 71/12 | (2023.01) | |
| H10K 77/10 | (2023.01) | |
| H10K 85/50 | (2023.01) | |
| H10K 85/60 | (2023.01) | |

(52) U.S. Cl.
CPC ............. *H10K 30/85* (2023.02); *H10K 30/40* (2023.02); *H10K 30/50* (2023.02); *H10K 71/12* (2023.02); *H10K 30/82* (2023.02); *H10K 77/111* (2023.02); *H10K 85/50* (2023.02); *H10K 85/60* (2023.02)

(58) Field of Classification Search
None
See application file for complete search history.

(56) References Cited

PUBLICATIONS

Mali et al., Materials Today, vol. 67, pp. 33-45, 2023. (Year: 2023).*
J. Burschka, N. Pellet, S. J. Moon, R. Humphry-Baker, P. Gao, M. K. Nazeeruddin, M. Gratzel, Nature 2013, 499, 316.
Y. Liu, S. H. Park, J. Kim, ACS Appl Mater Interfaces 2023, 15, 34742.
O. Ergen, S. M. Gilbert, T. Pham, S. J. Turner, M. T. Z. Tan, M. A. Worsley, A. Zettl, Nat Mater 2017, 16, 522.
S. A. Hashemi, S. Ramakrishna, A. G. Aberle, Energy Environ Sci 2020, 13, 685.
T. S. Sherkar, C. Momblona, L. Gil-Escrig, J. Ávila, M. Sessolo, H. J. Bolink, L. J. A. Koster, ACS Energy Lett 2017, 2, 1214.
C. Teixeira, R. Fuentes-Pineda, L. Andrade, A. Mendes, D. Forgács, Mater Adv 2023, 4, 3863.

(Continued)

*Primary Examiner* — Eli S Mekhlin
(74) *Attorney, Agent, or Firm* — Baumgartner Patent Law, LLC; Marc Baumgartner

(57) ABSTRACT

A method of fabricating a flexible perovskite solar cell is provided, the method comprising: coating a colloidal solution of phenyl-trimethyl-ammonium chloride (PTACl) and tin oxide onto a flexible substrate to provide an electron transport layer; coating the electron transport layer with a perovskite ink to provide a perovskite layer; coating the perovskite layer with a hole transport precursor solution to provide a hole transport layer; and depositing a metal electrode onto the hole transport layer, thereby fabricating a flexible perovskite solar cell.

18 Claims, 10 Drawing Sheets

(56) References Cited

PUBLICATIONS

D. Beynon, E. Parvazian, K. Hooper, J. McGettrick, R. Patidar, T. Dunlop, Z. Wei, P. Davies, R. Garcia-Rodriguez, M. Carnie, M. Davies, T. Watson, Advanced Materials 2023, 35, DOI 10.1002/adma.202208561.
H. Li, C. Zuo, D. Angmo, H. Weerasinghe, M. Gao, J. Yang, Nanomicro Lett 2022, 14, DOI 10.1007/s40820-022-00815-7.
C. Gong, S. Tong, K. Huang, H. Li, H. Huang, J. Zhang, J. Yang, Solar RRL 2020, 4, DOI 10.1002/solr.201900204.

\* cited by examiner

SCALABLE METHOD OF FABRICATING A FLEXIBLE PEROVSKITE SOLAR CELL

FIELD OF THE INVENTION

The present technology is directed to a method of fabricating a flexible perovskite solar cell having superior performance and resilience. More specifically, it is a flexible perovskite solar cell in which the electron transport layer is synthesized from a colloidal solution of tin oxide and phenyl-trimethyl-ammonium chloride (PTACl).

BACKGROUND OF THE INVENTION

Organic-inorganic metal halide perovskite solar cells (PSCs) offer high power conversion efficiency (PCE) at relatively low-cost fabrication processes (J. Burschka, N. Pellet, S. J. Moon, R. Humphry-Baker, P. Gao, M. K. Nazeeruddin, M. Grätzel, Nature 2013, 499, 316). PSCs are comprised of multiple thin film layers, with each layer serving a distinct function, including a hole transporter layer (HTL), an absorber layer, and an electron transporter layer (ETL) Y. Liu, S. H. Park, J. Kim, ACS Appl Mater Interfaces 2023, 15, 34742). The bandgap of the absorber layer, i.e., perovskite, can be tuned from 1.25 to 3 eV, allowing PSCs to be applied in multijunction solar cells, as well as indoor light harvesting. In addition, all layers in PSCs can be fabricated at sub-100° C., enabling their integration on flexible substrates (O. Ergen, S. M. Gilbert, T. Pham, S. J. Turner, M. T. Z. Tan, M. A. Worsley, A. Zettl, Nat Mater 2017, 16, 522) and wearable electronics (S. A. Hashemi, S. Ramakrishna, A. G. Aberle, Energy Environ Sci 2020, 13, 685).

The efficiency of large-area flexible PSCs, unfortunately, lags far behind that of rigid PSCs, primarily due to the challenges in fabricating uniform large-area thin films on rough flexible substrates. This is often accompanied by the appearance of many pinholes. Additionally, interfaces between the ETL and perovskite lead to carrier trapping defects and imbalanced charge transport, ultimately causing loss in performance and stability (T. S. Sherkar, C. Momblona, L. Gil-Escrig, J. Ávila, M. Sessolo, H. J. Bolink, L. J. A. Koster, ACS Energy Lett 2017, 2, 1214).

To address these challenges, various strategies have been developed. Teixeira et al. (C. Teixeira, R. Fuentes-Pineda, L. Andrade, A. Mendes, D. Forgács, Mater Adv 2023, 4, 3863) achieved a PCE of 7.7% by slot-die coating of all layers of flexible PCSs and passivating perovskite surface with long-chain ligands. Beynon et al. (D. Beynon, E. Parvazian, K. Hooper, J. McGettrick, R. Patidar, T. Dunlop, Z. Wei, P. Davies, R. Garcia-Rodriguez, M. Carnie, M. Davies, T. Watson, Advanced Materials 2023, 35, DOI 10.1002/adma.202208561) reported a PCE of 13.25% by employing roll-to-roll (R2R) technique to produce PSCs with tin (IV) oxide ($SnO_2$) as the ETL and Spiro-OMeTAD as the HTL. Li et al. (H. Li, C. Zuo, D. Angmo, H. Weerasinghe, M. Gao, J. Yang, Nanomicro Lett 2022, 14, DOI 10.1007/s40820-022-00815-7) showed a PCE of 13% in methylammonium lead iodide ($MAPbI_3$) PSCs fabricated by R2R coating under ambient air conditions. Gong et al. (C. Gong, S. Tong, K. Huang, H. Li, H. Huang, J. Zhang, J. Yang, Solar RRL 2020, 4, DOI 10.1002/solr.201900204) achieved a PCE of 10.57% in triple-cation (MA/FA/Cs) flexible PSCs by sequential R2R deposition.

What is needed is a method of fabricating flexible organic-inorganic metal halide perovskite solar cells. It would be preferable if it was scalable. It would be further preferable if the fabricating could be done under ambient conditions. It would be preferable if the flexible PSCs showed improved performance and increased resilience.

BACKGROUND OF THE INVENTION

Provided is a method of fabricating flexible organic-inorganic metal halide perovskite solar cells. The method is scalable. Fabrication can be done under ambient conditions. The resultant flexible PSCs show improved performance and increased resilience.

In one embodiment, a method of fabricating a flexible perovskite solar cell is provided, the method comprising: coating a colloidal solution of phenyl-trimethyl-ammonium chloride (PTACl) and tin oxide onto a flexible substrate to provide an electron transport layer; coating the electron transport layer with a perovskite ink to provide a perovskite layer; coating the perovskite layer with a hole transport precursor solution to provide a hole transport layer; and depositing a metal electrode onto the hole transport layer, thereby fabricating a flexible perovskite solar cell.

The method may further comprise selecting a concentration between 1 millimolar to 3 millimolar PTACl in the colloidal solution.

The method may further comprise selecting the concentration of 1 millimolar PTACl in the colloidal solution.

The method may further comprise selecting polyethylene terephthalate (PET) or polyethylene naphthalate (PEN) with an indium tin oxide coating as the flexible substrate.

The method may further comprise selecting PET with the indium tin oxide coating as the flexible substrate.

In the method, the flexible substrate may have a sheet resistance of 13-25 $\Omega sq^{-1}$.

The method may further comprise selecting $MAPbI_3$ ink as the perovskite ink.

In the method, the fabricating may be conducted under ambient conditions at a temperature no higher than 100° C.

In another embodiment, a flexible perovskite solar cell is provided, the flexible perovskite solar cell made by coating a colloidal solution of phenyl-trimethyl-ammonium chloride (PTACl) and tin oxide onto a flexible substrate to provide an electron transport layer; coating the electron transport layer with a perovskite ink to provide a perovskite layer; coating the perovskite layer with a hole transport precursor solution to provide a hole transport layer; and depositing a metal electrode onto the hole transport layer.

In the flexible perovskite solar cell, the concentration of PTACl in the colloidal solution may be between 1 millimolar and 3 millimolar.

In the flexible perovskite solar cell, the concentration of PTACl in the colloidal solution may be 1 millimolar.

In the flexible perovskite solar cell, the flexible substrate may be indium tin oxide coated PET.

In the flexible perovskite solar cell, the perovskite layer may be $MAPbI_3$.

In the flexible perovskite solar cell, the flexible substrate may have a sheet resistant of 13-25$\Omega$ $sq^{-1}$.

In another embodiment, a method of fabricating an electron transport layer on a flexible substrate is provided, the method comprising: preparing a colloidal solution of tin oxide and PTACl to provide an electron transport layer precursor; applying the electron transport layer precursor to the flexible substrate; and annealing the electron transport layer precursor, thereby fabricating the electron transport layer.

The method may further comprise selecting a concentration between 1 millimolar to 3 millimolar PTACl in the colloidal solution.

The method may further comprise selecting the concentration of 1 millimolar PTACl in the colloidal solution.

In the method, the annealing may be at 100° C. or less.

BRIEF DESCRIPTION OF DRAWINGS

FIG. 4A shows mechanical test results after 500 cycles of bending; FIG. 4B shows PCE results; FIG. 4C shows FF results; FIG. 4D shows open-circuit Voltage ($V_{oc}$) and the short-circuit current ($J_{sc}$); FIG. 4E shows J-V curve of champion devices; FIG. 4F shows EQE spectra of devices; and FIG. 4G shows the performance summary of reported all scalable n-i-p structure MAPbI$_3$ based flexible PSCs.

DETAILED DESCRIPTION OF THE INVENTION

Figure 1:
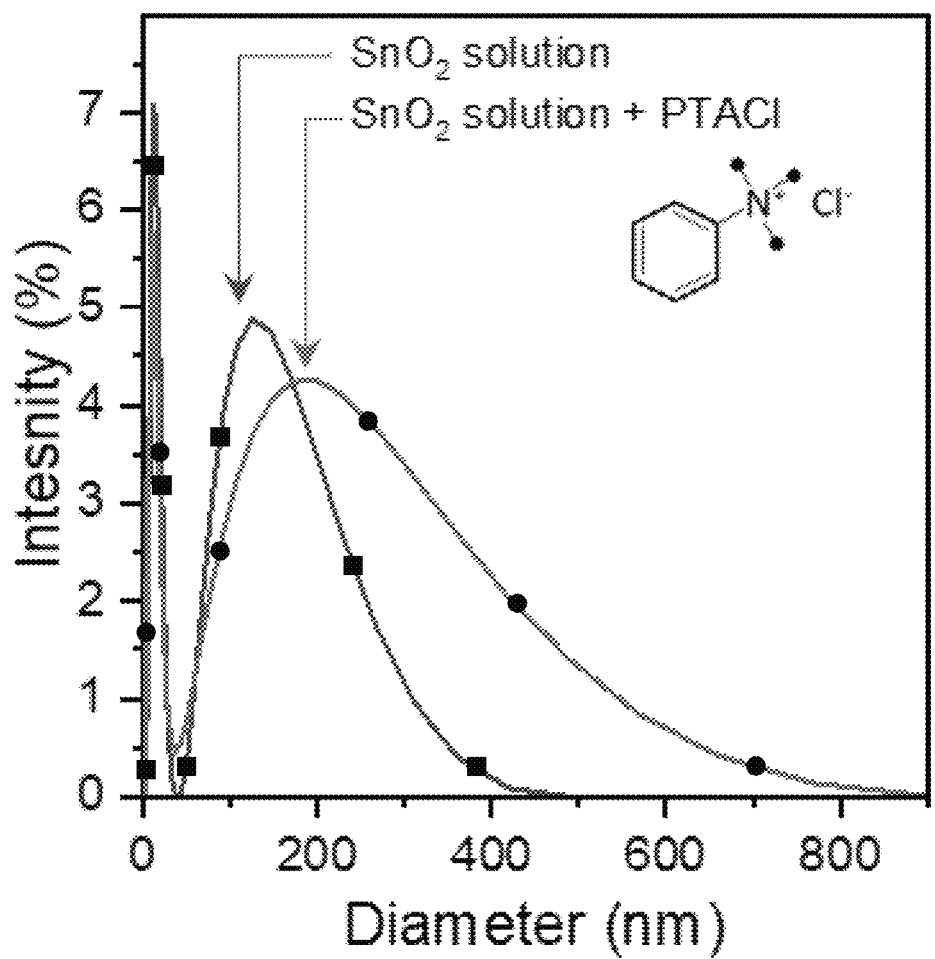
FIG. 1 is a graph showing the effect of adding PTACl to a tin oxide solution on the agglomerate size of tin oxide.
Figure 2A:
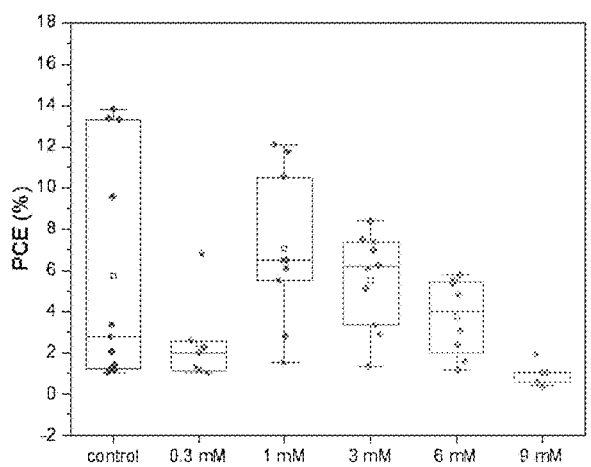
FIG. 2A is a graph showing the power conversion efficiency (PCE) of a flexible perovskite (MAPbI$_3$) PSC with an ETL made with a solution of tin oxide and a range of concentrations of PTACl.
Figure 2B:
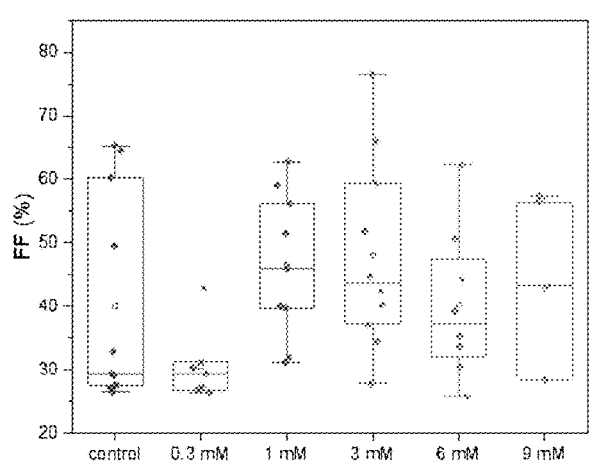
FIG. 2B is a graph showing the fill factor (FF %) of a flexible perovskite (MAPbI$_3$) PSC with an ETL made with a solution of tin oxide and a range of concentrations of PTACl I.
Figure 2C:
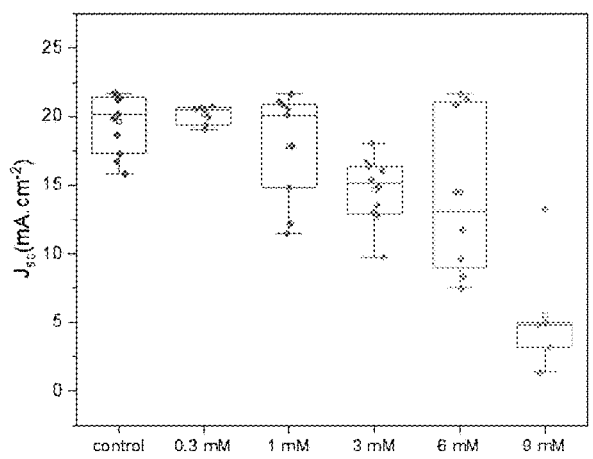
FIG. 2C is a graph showing the open-circuit Voltage ($V_{oc}$) of a flexible perovskite (MAPbI$_3$) PSC with an ETL made with a solution of tin oxide and a range of concentrations of PTACl.
Figure 2D:
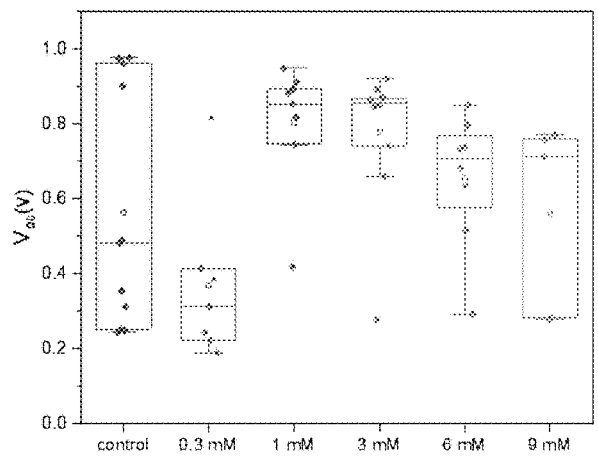
FIG. 2D is a graph showing the short-circuit current ($J_{sc}$) of a flexible perovskite (MAPbI$_3$) PSC with an ETL made with a solution of tin oxide and a range of concentrations of PTACl.

Except as otherwise expressly provided, the following rules of interpretation apply to this specification (written description and claims): (a) all words used herein shall be construed to be of such gender or number (singular or plural) as the circumstances require; (b) the singular terms "a", "an", and "the", as used in the specification and the appended claims include plural references unless the context clearly dictates otherwise; (c) the antecedent term "about" applied to a recited range or value denotes an approximation within the deviation in the range or value known or expected in the art from the measurements method; (d) the words "herein", "hereby", "hereof", "hereto", "hereinbefore", and "hereinafter", and words of similar import, refer to this specification in its entirety and not to any particular paragraph, claim or other subdivision, unless otherwise specified; (e) descriptive headings are for convenience only and shall not control or affect the meaning or construction of any part of the specification; and (f) "or" and "any" are not exclusive and "include" and "including" are not limiting. Further, the terms "comprising," "having," "including," and "containing" are to be construed as open-ended terms (i.e., meaning "including, but not limited to,") unless otherwise noted.

Recitation of ranges of values herein are merely intended to serve as a shorthand method of referring individually to each separate value falling within the range, unless otherwise indicated herein, and each separate value is incorporated into the specification as if it were individually recited herein. Where a specific range of values is provided, it is understood that each intervening value, to the tenth of the unit of the lower limit unless the context clearly dictates otherwise, between the upper and lower limit of that range and any other stated or intervening value in that stated range, is included therein. All smaller sub ranges are also included. The upper and lower limits of these smaller ranges are also included therein, subject to any specifically excluded limit in the stated range.

Unless defined otherwise, all technical and scientific terms used herein have the same meaning as commonly understood by one of ordinary skill in the relevant art. Although any methods and materials similar or equivalent to those described herein can also be used, the acceptable methods and materials are now described.

As one objective of the work was to fabricate a scalable flexible PSC, the first consideration was the substrate. Polyethylene terephthalate (PET) and polyethylene naphthalate (PEN) are the two most used substrates in flexible PSCs; while PEN is thermally more stable than PET, its high cost will likely exclude it from being a substrate choice when flexible PSCs are commercialized, nonetheless, the results presented herein for a PET substrate can be construed to be the same for PEN. PET has a maximum temperature tolerance of 100° C., thus any deposition procedure necessarily had to be done at ≤100° C. On this basis, PET/ITO/SnO$_2$/MAPbI$_3$/Spiro-OMeTAD/Au architecture was selected for the flexible PSCs. ITO is Indium tin oxide. SnO$_2$ (tin oxide) is an electron transport layer (ETL) and is deposited from a colloidal solution followed by annealing at 100° C. Spiro-OMeTAD (2,2',7,7'-Tetrakis [N,N-di(4-methoxyphenyl) amino]-9,9'-spirobifluorene) is a hole transport layer (HTL) and is deposited at 50° C. For the perovskite composition MAPbI$_3$ (Methylammonium lead iodide) was used as it can be made at 100° C. by slot-die coating of acetate/chloride salts.

PET/ITO substrates were observed to have surface bumps. These rough surfaces are unfortunately inherent to polymer substrates and are challenging to avoid. As the height of some of these bumps is comparable to the thickness of top layers taken together, they can act as shorting channels for electrical current if they are not fully covered by charge-carrier selective layers. Thus, the challenge was to fabricate an ETL that would cover the surface contours and that could be fabricated under ambient conditions at no more than 100° C.

As shown in FIG. 1, when Phenyl-Trimethyl-Ammonium Chloride (PTACl), which is a phase-transfer agent, was added to SnO$_2$ the size of the agglomerates doubled. This indicated that the phase-transfer agent increased the particle-to-particle interaction in the colloidal solution.

As shown in FIGS. 2A-D, a flexible substrate (PET/ITO with a sheet resistance of 13-25Ω sq-1, preferably 13-15Ω sq-1, was blade coated with a solution of SnO$_2$ having concentrations of PTACl ranging from zero to 9 millimolar (mM). The power conversion efficiency (PCE), fill factor (FF %), open-circuit Voltage ($V_{oc}$) and short-circuit current ($J_{sc}$) were measured in the resultant perovskite PSC. The flexible PSCs with PTACl showed a significant decrease in the electrical shorting behavior of devices, with 1 mM concentration of PTACl showing the highest average performance followed by 3 mM. Thus, a concentration range of about 1.0 mM to about 3 mM was considered to be advantageous.

Atomic force microscopy (AFM) images showed significantly larger grains of PTACl-$SnO_2$ films than those of the control. The AFM images also showed that the PTACl-modified $SnO_2$ films offered a lower root mean square (RMS) roughness of 1.165 than that of the control film with an RMS of 1.654.

Figure 3A:
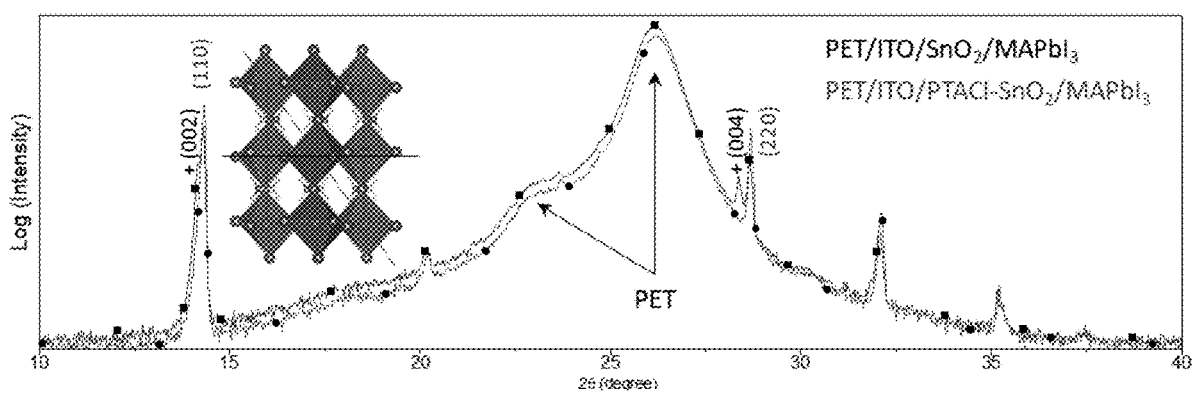
FIG. 3A is an XRD spectra of a flexible perovskite (MAPbI$_3$) PSC with a tin oxide ETL or a PATCl-tin oxide ETL, both on a PET/ITO flexible substrate.
Figure 3B:
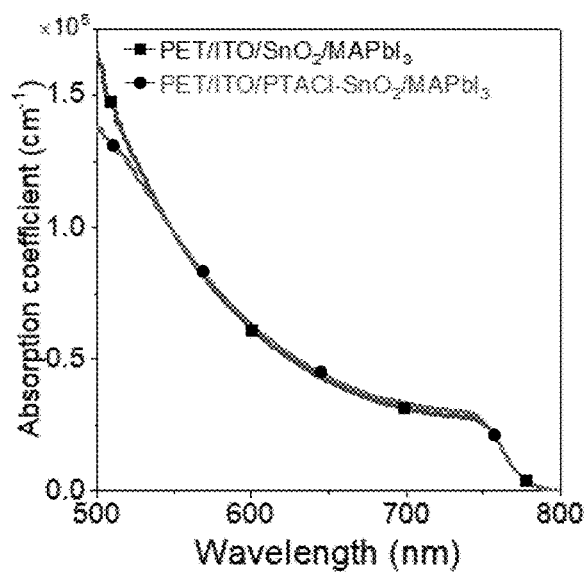
FIG. 3B is an absorption spectra of a flexible perovskite (MAPbI$_3$) PSC with a tin oxide ETL or a PATCl-tin oxide ETL, both on a PET/ITO flexible substrate.
Figure 3C:
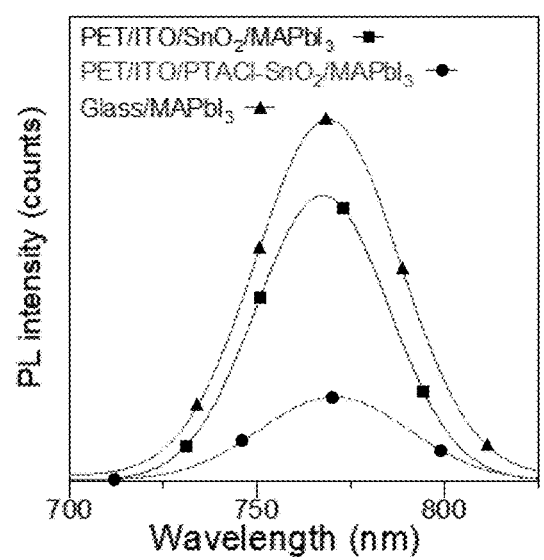
FIG. 3C is a PL spectra of a flexible perovskite (MAPbI$_3$) PSC with a tin oxide ETL or a PATCl-tin oxide ETL on a PET/ITO flexible substrate or on glass.
Figure 3D:
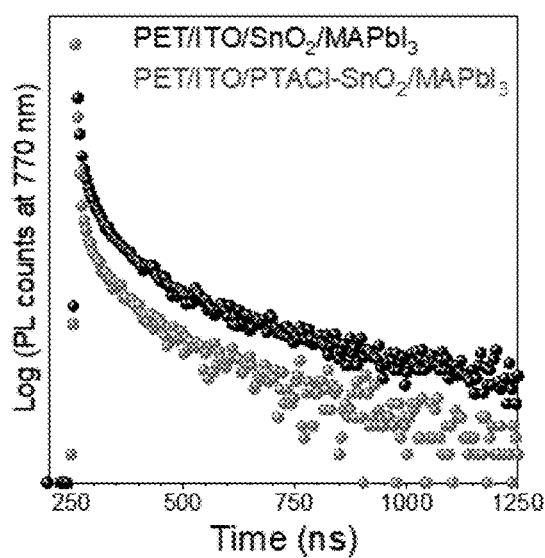
FIG. 3D shows photoluminescence (PL) decay of perovskite (MAPbI$_3$) PSC with a tin oxide ETL or a PATCl-tin oxide ETL on a PET/ITO flexible substrate.

As shown in FIGS. 3A, X-ray diffraction (XRD) shows that the perovskite in the perovskite film on control $SnO_2$ is oriented along both (110) and (002) crystallographic planes; in contrast, the perovskite is oriented along only (110) plane on PTACl-$SnO_2$ film. As shown in FIG. 3B, absorption spectra are similar for both perovskite films, with slightly superior absorption of perovskite on PTACl-$SnO_2$. As shown in FIGS. 3C and D, steady-state photoluminescence (PL) spectra and time-resolved photoluminescence (TRPL) decay show stronger and faster quenching of radiative recombination of perovskite on PTACl-$SnO_2$, indicating more efficient charge extraction by ETL modified with PTACl than without it.

Figure 4A:
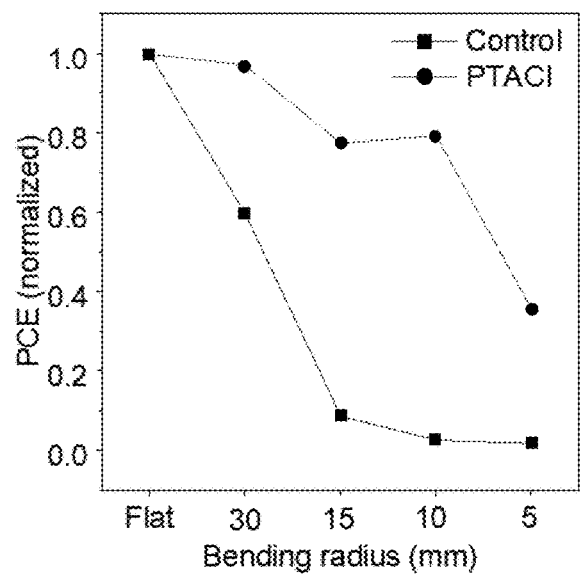
FIG. 4A-G are graphs of data from 40 (MAPbI$_3$) PSCs with a PATCl-tin oxide ETL on a PET/ITO flexible substrate versus a (MAPbI$_3$) PSCs with a tin oxide ETL.
Figure 4B:
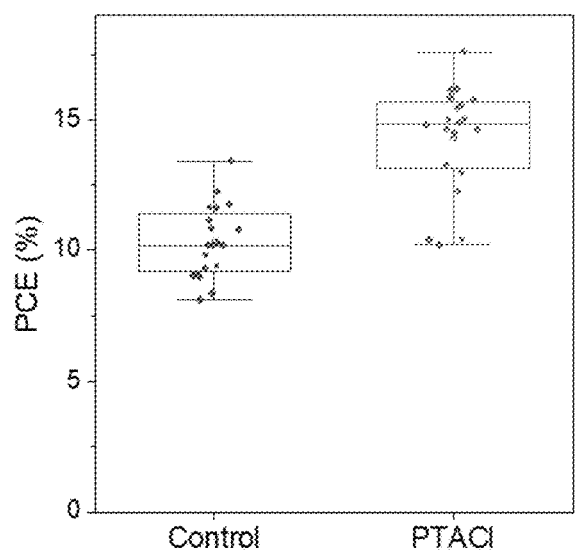

Forty PSCs were fabricated employing the scalable techniques of slot-die coating for perovskite ink, blade coating for $SnO_2$ and Spiro-OMeTAD, and thermally evaporating the gold counter electrode creating n-i-p structured flexible PSCs. Mechanical reliability tests were conducted. The PSCs were flexed to different bending radii for 500 cycles using a robotic arm, followed by re-measuring their efficiency. As shown in FIG. 4A, the devices with PTACl showed an enhanced mechanical toughness showing minor performance loss when bending down to 10 mm radius. Without being bound to theory, as the only difference between the control and target devices was the ETL, the observed mechanical toughness was attributed to improved adhesion at the $SnO_2$/perovskite interface enabled by PTACl.

As shown in FIGS. 4B-F the resultant PSC had a PCE of 17.6%, along with short circuit current ($J_{sc}$), open circuit voltage ($V_{oc}$) and a FF of ~23 mA/$cm^2$, 0.95 V, and ~80%, respectively. As shown in FIG. 4G this efficiency is among the highest documented for all-scalable n-i-p structured $MAPbI_3$-based flexible PSCs fabricated in ambient air conditions. Control devices without PTACl achieved the highest PCE of 13.4%. Accordingly, a PCE of 15% or higher was considered to be a significant improvement over control devices.

Figure 4C:
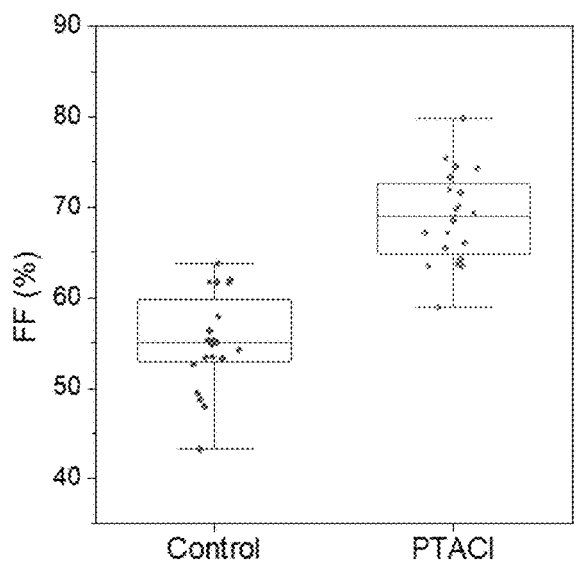
Figure 4D:
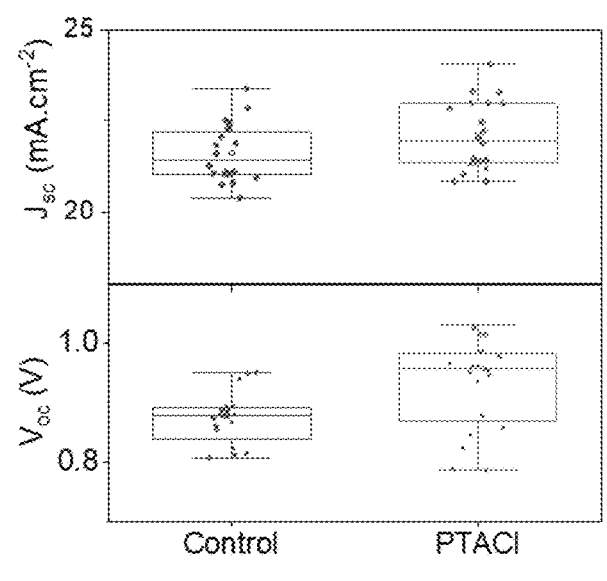
Figure 4E:
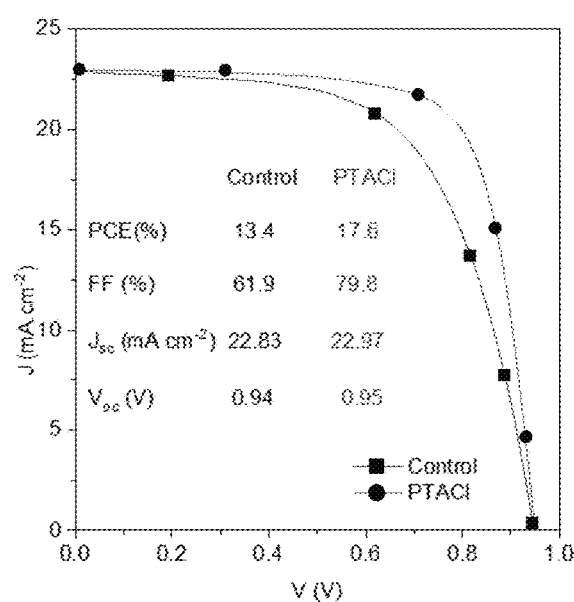
Figure 4F:
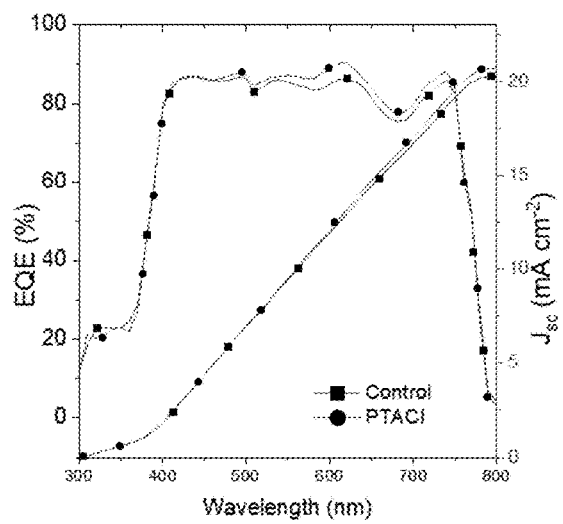
Figure 4G:
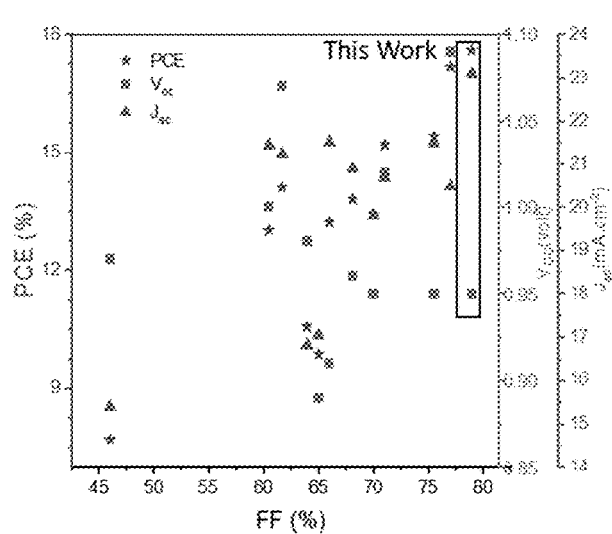

A major improvement in the performance of PTACl-based flexible PSCs originated from an increase in FF, due to improved coverage of $SnO_2$ and reduced shorting pathways as seen in FIG. 4C. As shown in FIG. 4D a noticeable increase in $V_{oc}$ was observed due to enhanced electron extraction discussed above. As shown in FIG. 4F a minor increase in $J_{sc}$ is because of improved absorption as noted above, in agreement with external quantum efficiency (EQE) spectra.

Figure 5:
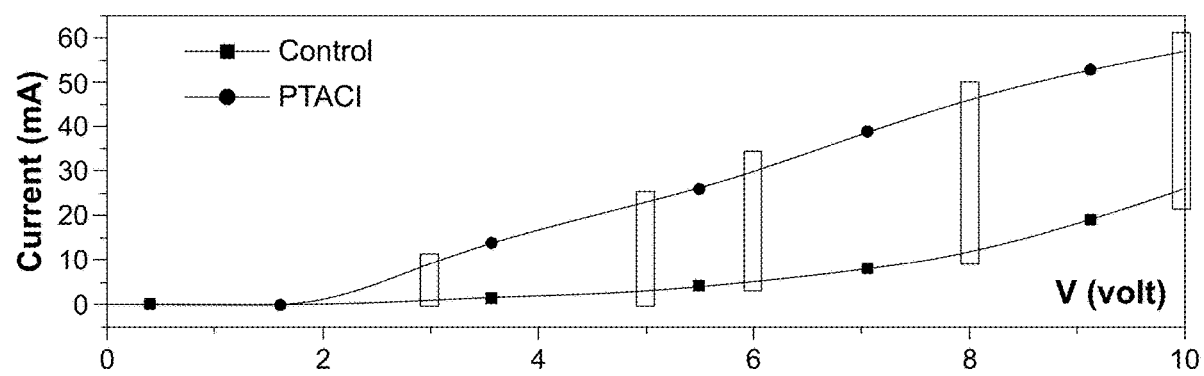
FIG. 5 is a graph showing JV characteristic of flexible PSCs under forward bias.

As shown in FIG. 5, the devices also showed improved electroluminescence under forward bias as recorded by infrared camera indicating improved band alignment and charge injection with PTACl.

In an alternative embodiment the metal electrode was silver. In another alternative embodiment, the metal electrode was aluminum. In an alternative embodiment, the perovskite was formamidinium lead iodide. In another alternative embodiment, the perovskite was formamidinium lead chloride. In yet another embodiment, the perovskite was methylammonium lead chloride. In yet another embodiment, the perovskite had an 'ABX3' composition, where 'A' was a monovalent cation (methylammonium (MA+), formamidinium (FA+) or Cs+), 'B' was a divalent cation (Pb2+ or Sn2+), and 'X' was a halogen (I—, Br— or Cl—), with an annealing temperature of no more than 100° C. In yet another embodiment, the perovskite was an MA:FA perovskite.

The addition of PTACl to $SnO_2$ induced two distinct outcomes. Firstly, it promoted the formation of larger agglomerates of $SnO_2$ nanoparticles. The PTACl served to bind these nanoparticles together, resulting in the formation of larger agglomerates. Secondly, it facilitated the oriented growth of perovskite crystals. Following the application of PTACl-$SnO_2$ and preceding the deposition of the subsequent perovskite layer, ozone treatment was performed to enhance surface properties, including the reduction of surface energy and contact angle. This ultraviolet-ozone (UVO) treatment aided in the removal of the organic component of PTACl, leaving behind chlorine, which, in turn, contributed to the oriented growth of the top perovskite layer.

Materials and Methods

Preparation of perovskite precursor solution: The precursor solution for $MAPbI_3$ perovskite was formulated by dissolving MAI and $PbX_2$ (where X=Ac, Cl) in a 3:1 ratio, and $PbAc_2$:$PbCl_2$ in an 8:1 ratio, dissolved in DMF to create a 0.75 M solution.

Preparation of Spiro-OMeTAD: Dissolving 0.1 g of Spiro-OMeTAD in 1.1 mL of chlorobenzene, followed by mixing 23 µL of Li-TFSI solution (520 mg mL-1 in acetonitrile), 39 µL of tBP, and 10 µL of FK 209 Co(III) TFSI solution (375 mg mL-1 in acetonitrile) into the Spiro solution. The mixture was filtered before use.

Device Fabrication: The device fabrication process comprised several sequential steps. Firstly, 3.25×7.5 cm PET/ITO substrates were meticulously cleaned using deionized water, and isopropyl alcohol via 15 minutes of sonication each. Post-cleaning, the substrates were dried using an oven. Subsequent to the cleaning regimen, a 15-minute ozone treatment was administered prior to the deposition of the $SnO_2$ layer. All-scalable method employed the blade coating technique for the deposition of the ETL and HTL. In the process of depositing the ETL using blade coating, initially, a 1 mM solution of PTACl in deionized water was prepared. This solution was then combined with the main $SnO_2$ solution, which was diluted in deionized water at a 1:5 ratio, to create the final $SnO_2$-PTACl solution. This final solution was drop-cast onto the center of the ITO substrate and afterwards spread using blade coating on a surface that was heated.

The $SnO_2$/PTACl-coated substrates were then annealed at 100° C. for 30 minutes on a hot plate. The perovskite layer was deposited utilizing a slot-die coater for all-scalable method. Before perovskite layer deposition, the $SnO_2$-coated substrates underwent a 15-minute UV ozone treatment. The perovskite precursor solution was coated onto the $SnO_2$ layer at a speed of 15 mm/s, maintaining a 100 µm gap between the substrate and the meniscus. The solution feed rate was sustained at 0.5 mL/s using a syringe pump, with a continuous nitrogen flow at 10 m/s. The base temperature of the slot-die coater was preset at 65° C. prior to perovskite deposition. A subsequent thermal annealing step at 100° C. for 10 minutes was applied to the perovskite-coated substrate.

For the application of blade coated HTL: A solution of Spiro-OMeTAD (50 µL) was applied onto the perovskite film using drop casting and subsequently blade coated onto a heated substrate.

All these procedures were carried out under ambient air conditions. Finally, gold electrodes of 80 nm thickness were deposited through thermal evaporation in a vacuum environment of $10^{-6}$ Torr. The characterization phase involved the fabrication of PSCs in atmospheric conditions.

While example embodiments have been described in connection with what is presently considered to be an example of a possible most practical and/or suitable embodiment, it is to be understood that the descriptions are not to be limited to the disclosed embodiments, but on the contrary, is intended to cover various modifications and equivalent arrangements included within the spirit and scope of the example embodiment. Those skilled in the art will recognize or be able to ascertain using no more than routine experimentation, many equivalents to the specific example embodiments specifically described herein. Such equivalents are intended to be encompassed in the scope of the claims, if appended hereto or subsequently filed.

The invention claimed is:

1. A method of fabricating a flexible perovskite solar cell, the method comprising: coating a colloidal solution of phenyl-trimethyl-ammonium chloride (PTACl) and tin oxide onto a flexible substrate to provide an electron transport layer; coating the electron transport layer with a perovskite ink to provide a perovskite layer; coating the perovskite layer with a hole transport precursor solution to provide a hole transport layer; and depositing a metal electrode onto the hole transport layer, thereby fabricating a flexible perovskite solar cell.

2. The method of claim 1, further comprising selecting a concentration between 1 millimolar to 3 millimolar PTACl in the colloidal solution.

3. The method of claim 2, further comprising selecting the concentration of 1 millimolar PTACl in the colloidal solution.

4. The method of claim 3, further comprising selecting indium tin oxide coated polyethylene terephthalate (PET) or indium tin oxide coated polyethylene naphthalate (PEN) as the flexible substrate.

5. The method of claim 3, wherein the flexible substrate has a sheet resistance of 13-25Ω sq-1.

6. The method of claim 4 wherein the fabricating is conducted under ambient conditions at a temperature no higher than 100° C.

7. The method of claim 6, further comprising selecting indium tin oxide coated PET as the flexible substrate.

8. The method of claim 6, further comprising selecting $MAPbI_3$ ink as the perovskite ink.

9. A flexible perovskite solar cell, the flexible perovskite solar cell made by coating a colloidal solution of phenyl-trimethyl-ammonium chloride (PTACl) and tin oxide onto a flexible substrate to provide an electron transport layer; coating the electron transport layer with a perovskite ink to provide a perovskite layer; coating the perovskite layer with a hole transport precursor solution to provide a hole transport layer; and depositing a metal electrode onto the hole transport layer.

10. The flexible perovskite solar cell of claim 9, wherein the concentration of PTACl in the colloidal solution is between 1 millimolar and 3 millimolar.

11. The flexible perovskite solar cell of claim 10, wherein the concentration of PTACl in the colloidal solution is 1 millimolar.

12. The flexible perovskite solar cell of claim 11, wherein the flexible substrate is indium tin oxide coated PET.

13. The flexible perovskite solar cell of claim 12, wherein the perovskite layer is $MAPbI_3$.

14. The flexible perovskite solar cell of claim 13, wherein the flexible substrate has a sheet resistant of 13-25Ω sq-1.

15. A method of fabricating an electron transport layer on a flexible substrate, the method comprising: preparing a colloidal solution of tin oxide and PTACl to provide an electron transport layer precursor; applying the electron transport layer precursor to the flexible substrate; and annealing the electron transport layer precursor, thereby fabricating the electron transport layer.

16. The method of claim 15, further comprising selecting a concentration between 1 millimolar to 3 millimolar PTACl in the colloidal solution.

17. The method of claim 16, further comprising selecting the concentration of 1 millimolar PTACl in the colloidal solution.

18. The method of claim 17, wherein the annealing is at 100° C. or less.

* * * * *